United States Patent [19]

Crandall et al.

[11] Patent Number: 5,022,051
[45] Date of Patent: Jun. 4, 1991

[54] DC-FREE LINE CODE FOR ARBITRARY DATA TRANSMISSION

[75] Inventors: Douglas Crandall, Berkeley; Steven R. Hessel, Campbell; Thomas Hornak, Portola Valley, all of Calif.; Rasmus Nordby, Horsholm, Denmark; Kent H. Springer, Westford, Mass.; Craig Corsetto, Ijamsville, Md.

[73] Assignee: Hewlett-Packard Company, Palo Alto, Calif.

[21] Appl. No.: 266,459

[22] Filed: Nov. 2, 1988

[51] Int. Cl.[5] .................. H04L 25/06; H04L 25/32
[52] U.S. Cl. ........................................ 375/19; 371/55
[58] Field of Search .................. 375/19; 371/55, 56; 361/246; 341/93

[56] References Cited

U.S. PATENT DOCUMENTS

| 4,216,426 | 8/1980 | Flora | 375/19 |
| 4,408,189 | 10/1983 | Betts et al. | 375/19 X |
| 4,464,765 | 8/1984 | Shimizu | 375/19 |
| 4,682,334 | 7/1987 | Le Mouel et al. | 371/55 |

OTHER PUBLICATIONS

Widmar and Franaszek; "A DC-Balanced, Partitioned Block, 8B/10B Transmission Code", IBM Journal of Research and Development, vol. 27, No. 5, pp. 440-451, Sep. 1983.

Primary Examiner—Douglas W. Olms
Assistant Examiner—Ralph Smith

[57] ABSTRACT

Means and structure for encoding binary data ensures that, on average, the encoded data provides a balanced data stream having an equal number of logical one and logical zero bits. An indicator bit of known value is appended to N data bits, forming a group of N+1 bits. The polarity of this group is determined, i.e. whether the group contains more ones than zeros. The cumulative polarity of all bits sent over the communication link is also maintained. When the polarity of the group is the same as the cumulative polarity, all bits in the group are inverted and the inverted group is transmitted. Otherwise the bits in the group are transmitted in their original form. To decode the transmitted bits, the bit stream is framed to separate each series of N+1 bits. The value of the indicator bit on the receiver side of the communication link indicates whether the group has been inverted. If the group has been inverted, it is reinverted on the receiver side of the link to provide the N data bits in their original form. Conversely, if the group has not been inverted, it is not reinverted on the receiver side of the link to provide the N data bits in their original form. In alternative embodiments, additional bits are appended to the N data bits and the indicator bit in order to allow transmission of additional information.

18 Claims, 11 Drawing Sheets

DC-FREE LINE CODE FOR ARBITRARY DATA TRANSMISSION

BACKGROUND OF THE INVENTION

This invention pertains to a method and apparatus for encoding binary data before it is submitted to a serial communication link transmitter and the restoration (decoding) of the encoded binary data to its original form after it has been received by a serial communication link receiver.

The purpose of encoding data is to ensure that for any arbitrary data to be transmitted over a link the line code is balanced, i.e. that the encoded data propagating over the link consists on average of an equal number of logical one bits and logical zero bits. This permits the link transmitter and link receiver to be implemented as ac coupled circuits. Such balanced line codes are desirable, for example, when the signal path in the serial communication link must include transformers for prevention of ground loops and common mode signal propagation. Also, in high speed fiber optic transmitters, a laser driven by a balanced line code requires an average drive current which is data independent and therefore easy to regulate. In high speed fiber optic receivers a balanced line code allows easy separation of the information carrying ac component of the photodetector current from the much larger dc bias currents of the receiver amplifier.

Previously used methods of encoding data into a balanced line code include, for example, 8B/10B encoding, described by Widmar and Franaszek, "A DC-Balanced, Balanced, Partitioned Block, 8B/10B Transmission Code", IBM Journal of Research and Development, Vol. 27, No. 5, September 1983, pp. 440–451. In 8B/10B encoding, subsequent groupings of 8 consecutive bits of the original data are each represented by a 10 bit word properly selected to ensure a balanced line code. The 10 bit words are then transmitted over the communication link. 8B/10B encoding and decoding are complex and the bandwidth penalty is 25% because the communication link must transmit 10 bits of the balanced code within the time span of 8 bits of the original data.

SUMMARY

In accordance with the teachings of this invention, a novel means and structure for encoding binary data is taught such that, on average, the encoded data provides a balanced serial data stream having an equal number of bits with value of logical one and logical zero. In accordance with this invention, a plurality of data bits are obtained to form an N bit word, where N is any positive integer. An indicator bit of known value is appended to the N bit word, forming a group of N+1 bits. The polarity of this group of N+1 bits is determined, i.e. whether the group contains more ones than zeros, more zeros than ones, or an equal number of ones and zeros. The cumulative polarity of all bits sent over the communication link is also maintained. When the polarity of the group is the same as the cumulative polarity of all previously transmitted bits, all bits in the group are inverted to their opposite binary values, and the inverted group is transmitted. Conversely, when the polarity of the group is the opposite of the cumulative polarity of all previously transmitted bits, the bits in the group are not inverted, but are transmitted in their original form. When the polarity of the group is neutral, the bits in the group are either inverted or left in their original form for transmission, as a neutral group has no effect on the cumulative polarity. In this manner, the number of bits transmitted having a value of zero and the number of bits transmitted having a value of one are kept roughly equal, thereby minimizing the DC component of the transmitted signal.

In order to decode the transmitted bits, the serial bit stream is framed to separate each series of N+1 bits, thereby separating the transmitted groups on the receiver side of the communication link. Since the position of the appended indicator bit within the group is known, as well as its value prior to possible inversion of the group on the transmitter side of the communication link, the value of the indicator bit on the receiver side of the communication link indicates whether the group has been inverted on the transmitter side of the link. If the group has been inverted on the transmitter side of the link, it is reinverted on the receiver side of the link to provide the N data bits in their original form. Conversely, if the group has not been inverted on the transmitter side of the link, it is not reinverted on the receiver side of the link to provide the N data bits in their original form.

In alternative embodiments, additional bits are appended to the N data bits and the indicator bit in order to allow transmission of additional information.

DETAILED DESCRIPTION

Figure 1:
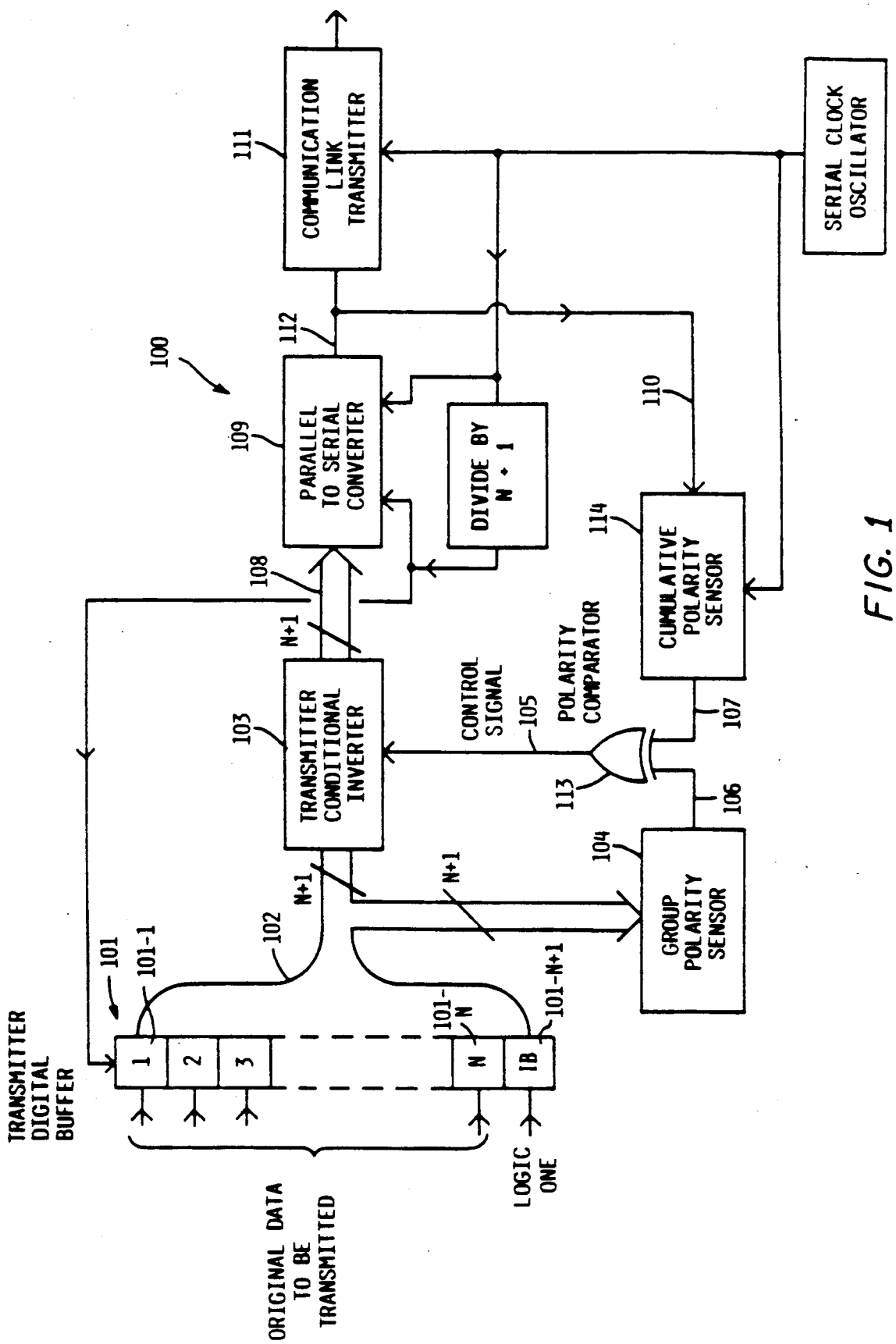
FIG. 1 is a diagram depicting an apparatus suitable for use in accordance with the teachings of this invention for use in encoding data on the transmitter side of a communications link to form a group of bits for transmission.

According to the present invention, the original data bits are lumped into consecutive groups of N bits, where N is limited only by practical considerations, such as circuit complexity and latency. The consecutive groups are then encoded, transmitted, and decoded in sequence. By encoding data in groups of N bits, the restoration of the N bits on the receiver side must wait for the transmission of all N bits. By increasing N, this delay becomes larger, thereby increasing the latency of the circuitry.

The first step in encoding a group of N bits consists of appending an indicator bit to the group. The binary value of this bit (i.e. if it is a zero or a one) as well as its position within the group is predefined and known also at the receiving end of the communication link. The next encoding step is to sense the polarity of each of the individual groups, which now each consist of N+1 bits. Positive polarity means the group contains more ones than zeros, negative polarity means the group contains more zeros than ones, and neutral polarity means the group contains an equal number of ones and zeros (possible only if N+1 is an even number). After sensing the polarity of the group, the N+1 bits are transmitted to the receiver either leaving all N+1 bits unchanged, or after inverting each of the N+1 bits to its opposite binary value prior to transmission. Inversion of the N+1 bits results in changing a positive polarity into a negative polarity, and vice versa. In addition to transmitting the N+1 bits to the receiver, the cumulative polarity of all previous bits transmitted to the receiver is maintained by storing and updating the difference in the number of ones and zeros transmitted over the link in the past.

The decision whether to invert or not to invert the N+1 bits within a group prior to transmission of that group to the receiver is made in the following manner:

1. If the polarity of a group of N+1 bits to be transmitted is opposite of the cumulative polarity of all previously transmitted bits, the bits of the group are not inverted.

2. If the polarity of a group of N+1 bits to be transmitted is the same as the cumulative polarity of all previously transmitted bits, the bits of the group are inverted.

3. If either of the two sensed polarities is neutral, the encoding proceeds correctly regardless of whether the bits are or are not inverted. An indication of neutral polarity is therefore not needed. This means that encoding, transmission, and decoding of data occurs properly regardless of whether a neutral polarity is treated by both transmitter and receiver portions of the link as either having a positive polarity, or a negative polarity.

In accordance with the teachings of this invention, no transmitted group of N+1 bits ever has the same polarity as the cumulative polarity of the previously transmitted bits. The maximum imbalance between the number of ones and zeros transmitted over the link at any time never exceeds 1.5*(N+1). This extreme occurs when the cumulative polarity of all past bits is neutral, all N+1 bits of the next group are of uniform binary value, and the following group of N+1 bits has neutral polarity and begins with (N+1)/2 bits having the same binary value as the binary value of each bit in the previous group, as depicted in the example of Table I, where N+1=10.

TABLE I

| Group Number | Group Bits | Group Polarity | Cumulative Polarity After Transmission | Imbalance |
|---|---|---|---|---|
| a | don't care | N/A | neutral | 0 |
| a + 1 | 1111111111 | positive | positive | +10 |
| a + 2 | 11111 / 00000 | neutral | positive | +15 / +10 |

In accordance with the teachings of this invention, decoding on the receiver side of the serial link is easily accomplished. A series of groups of N+1 bits are received as transmitted. Each group is decoded in turn. A group of N+1 bits is decoded by first identifying in the serial data stream the position of the indicator bit which was added to the N original bits on the transmitter side of the link. This requires that the boundaries between consecutive groups of N+1 bits be determined on the receiver side. This "framing" is achieved, for example, by initially transmitting serial data which constitute a training sequence, i.e. a few groups of N+1 bits with all N data bits of the same binary value as the added indicator bit. As shown in Table II, due to the encoding method of this invention, as described above, the resulting serial receiver output is a sequence of groups of N+1 bits in which all N+1 bits in a given group have the same binary value, but where the binary value of groups is changing. A group boundary, and subsequently the periodic position of the appended indicator bit (predefined within the group), is now easily determined by sensing the binary value transitions in the serial bit stream.

TABLE II

| Training Data | Indicator Bit | Group | Group Polarity | Cumulative Polarity Before Transmission | Transmitted Group (Receiver Output) |
|---|---|---|---|---|---|
| 11111111 | 1 | 111111111 | positive | neutral | 111111111 |
| 11111111 | 1 | 111111111 | positive | positive | 000000000 |
| 11111111 | 1 | 111111111 | positive | neutral | 111111111 |
| 11111111 | 1 | 111111111 | positive | positive | 000000000 |

Upon reception of a group of N+1 bits, if the binary value of the indicator bit is the same as its predefined value, the group has not been inverted prior to transmission. Therefore the whole group of N+1 bits is left unchanged on the receiver side. Conversely, if the binary value of the received indicator bit is the opposite of its predefined value, the group has been inverted prior to transmission and is therefore inverted again on the receiver side to restore the data bits to their original values. The last step on the receiver side is to delete the indicator bit and output the group of N bits which are now guaranteed to be identical to the original data.

One advantage of this invention is that the bandwidth penalty is 1/N and can be made arbitrarily small, subject only to practical limitations, such as circuit complexity and latency of the circuitry. Another advantage is that only simple hardware is required. A third advantage is that the teachings of this invention are particularly well suited for use with a clock recovery technique and a frame synchronization technique disclosed in U.S. Pat. application Ser. No. 273,302 on an invention of Corsetto et al. entitled "Phase Locked Loop for Clock Extraction in Gigabit Rate Data Communication Links".

Figure 2:
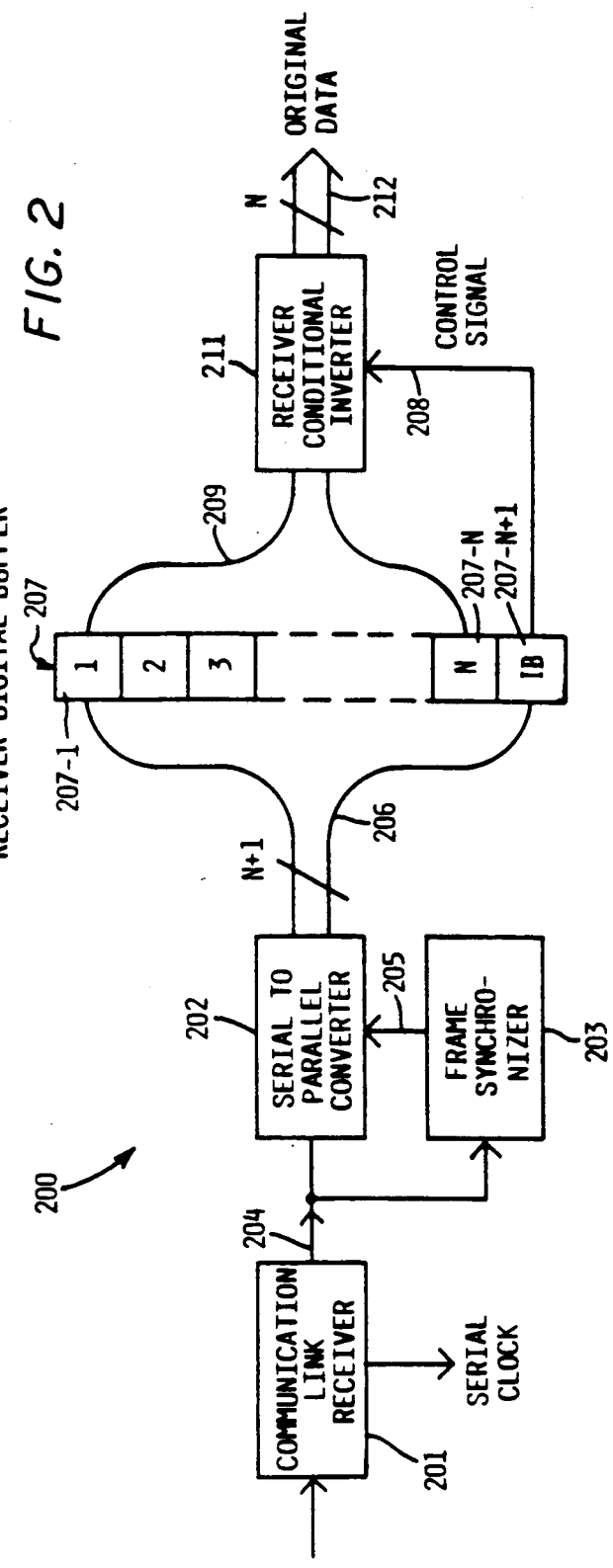
FIG. 2 is a diagram depicting an apparatus suitable for use in accordance with the teachings of this invention for use in decoding a group of bits on the receiver side of a communications link in order to extract data.

An example of an apparatus construction in accordance with the teachings of this invention suitable for performing the above described method is now described with respect to FIG. 1 (the transmitter side) and FIG. 2 (the receiver side).

The data to be transmitted is made available in consecutive N bit words stored in a bank of N cells 101-1 through 101-N of Transmitter Digital Buffer 101. These N bits can be provided to Transmitter Digital Buffer 101 in any convenient fashion, for example either serially or, as shown in FIG. 1, in parallel. Cell 101-N+1 of Transmitter Digital Buffer 101 is permanently loaded with the indicator bit, which is selected to be a binary one in the example of FIG. 1. All N+1 buffer cells of Transmitter Digital Buffer 101 are clocked out simultaneously and deliver an N+1 bit word to Transmitter Conditional Inverter 103 and to Group Polarity Sensor 104 via N+1 bit wide data bus 102.

Figure 3:
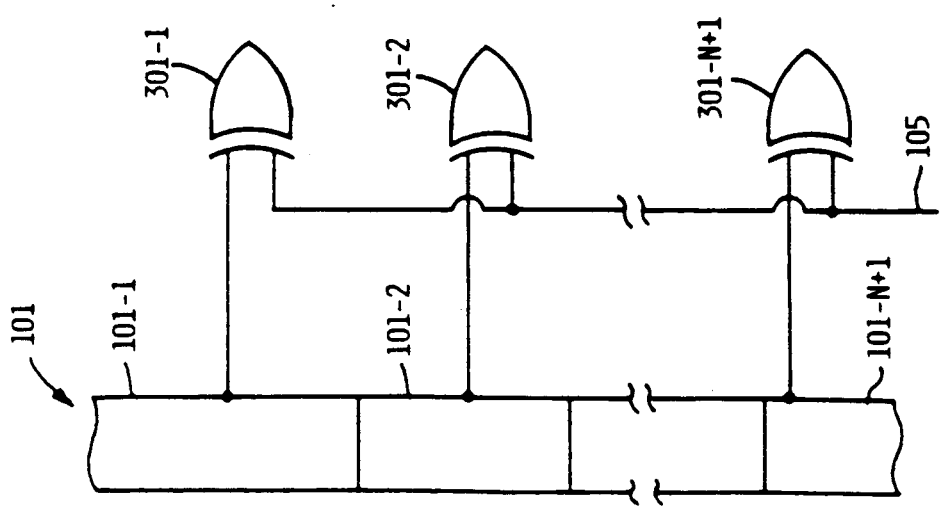
FIG. 3 is a diagram depicting one embodiment of Transmitter Conditional Inverter 103 of FIG. 1.

In one embodiment, shown in FIG. 3, Transmitter Conditional Inverter 103 consists of a bank of N+1 Exclusive OR gates 301-1 through 301-N+1. One input lead of each of the N+1 Exclusive OR gates is connected to receive the output bit from an associated one of the cells within Transmitter Digital Buffer 101. The other input of each of the N+1 Exclusive OR gates is connected in common to receiving control signal from control line 105.

Figure 4:
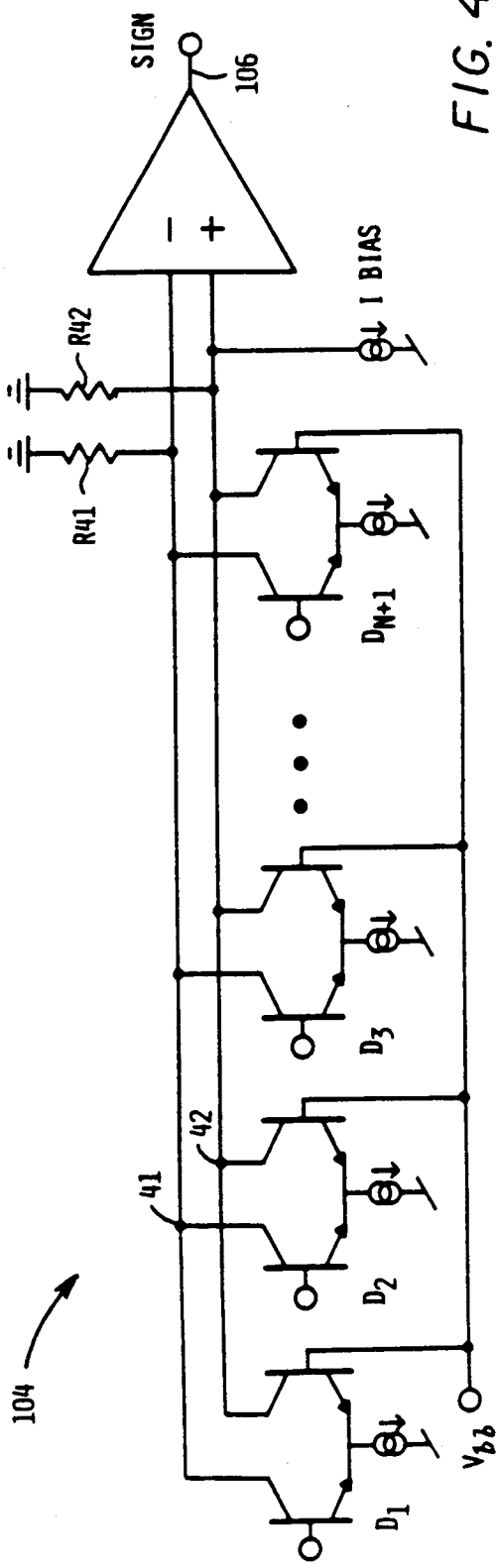
FIG. 4 is a schematic diagram of one embodiment of group polarity sensor 104 of FIG. 1.

Referring to FIG. 1, Group Polarity Sensor 104 serves to sense the polarity of the N+1 bit word received via bus 102. In one embodiment, shown in FIG. 4, Group Polarity Sensor 104 is implemented as N+1 current switches $D_1$ through $D_{N+1}$, each controlled by one of the N+1 bits. Each current switch routes its current to the first of two current summing nodes 41, 42 if its respective bit is a logical one and to the second of two current summing nodes if its respective bit is a logical zero. This arrangement is very similar to a current switching Digital-to-Analog Converter (DAC), except that in a DAC the current switches carry currents of magnitude scaled in a binary ratio, while in this embodiment of Group Polarity Sensor 104 all switched currents are of the same magnitude. By comparing the currents in the two summing nodes to each other in comparator 104 based on voltages created across load resistors R41 and R42, an output signal is provided on lead 106 indicating the polarity of the group of N+1 bits on bus 102. Given practical considerations, even if N+1 is an even number and the group has neutral polarity, the two summing node currents will never be exactly the same. Therefore Group Polarity Sensor 104 responds to neutral polarity with either a positive polarity or negative polarity output signal on lead 106, which is acceptable as described above. In an alternative embodiment, a small bias current ($I_{BIAS}$ of FIG. 4) is added to one of the two current summing nodes to force a predetermined decision for a neutral polarity.

Referring to FIG. 1, Parallel to Serial Converter 109 receives the N+1 bits from Transmitter Conditional Inverter 103 via bus 108. In one embodiment, Parallel to Serial Converter 109 is implemented in a well known manner as a N+1 stage wide, parallel-in/serial-out shift register, such as the SN54165 device, as shown in "The TTL Data Book", 2nd Edition, Texas Instruments, pages 7-212 et seq. In an alternative embodiment, Parallel to Serial Converter 109 is implemented in a well known manner utilizing a 16:1 multiplexer, such as described for example in "A Gb/s High Yield and Lower Power Dissipation," Kameyama et al., *IEEE GaAs IC Symposium* (1987) pages 265-268. Parallel to Serial Converter 109 provides a serial data stream on output lead 112 for driving Communication Link Transmitter 111 which comprises, for example, a laser driver in a fiber optic link.

The output signals from Parallel to Serial Converter 109 are also applied to Cumulative Polarity Sensor 114 via lead 110. In one embodiment, Cumulative Polarity Sensor 114 consists of a prior art up/down counter clocked at the serial data rate of Parallel to Serial Converter 109. The range of such an up/down counter must be sufficient to handle the maximum imbalance between the number of ones and zeros transmitted over the link at any given time in both directions, i.e. in a first direction when the number of ones exceeds the number of zeros, and in a second direction when the number of zeros exceeds the number of ones. Since, as previously stated, the maximum imbalance is equal to 1.5*(N+1), the range of such an up/down counter must be at least 3*(N+1). The up/down control input lead of the up/down counter is driven by the serialized data stream received on lead 110 so that when the serial bit on lead 110 is, for example, a logic one, the up/down counter counts up by one and, conversely, when the serial bit on lead 110 is a logic zero, the up/down counter counts down by one. The binary value of the most significant bit of the up/down counter serves as the output signal from Cumulative Polarity Sensor 114.

The output signals from Group Polarity Sensor 104 and Cumulative Polarity Sensor 114 are applied via leads 106 and 107, respectively, to the input leads of Polarity Comparator 113, which in one embodiment comprises an Exclusive OR gate. Polarity Comparator 113 produces a control signal on output lead 105 which in turn drives Transmitter Conditional Inverter 103. This control signal is given a first binary value when the output signals from Group Polarity Sensor 104 and Cumulative Sensor 114 are equal, and an opposite binary value when the output signals from Group Polarity Sensor 104 and Cumulative Polarity Sensor 114 are not equal.

FIG. 2 shows a diagram of one embodiment of receiver side circuitry suitable for use in accordance with the teachings of this invention.

On the receiver side the received serial signal is applied from Communication Link Receiver 201 to Serial to Parallel Converter 202 via lead 204. In one embodiment, Serial to Parallel Converter 202 comprises a serial-in/parallel-out shift register, for example the SN54164 device as described in "The TTL Data Book," 2nd Edition, Texas Instruments, pages 7–206 et seq. In an alternative embodiment, Serial to Parallel Converter 202 comprises a demultiplexer with suitable addressing circuitry as described above with regard to the Kameyama et al. reference.

Parallel data from Serial to Parallel Converter 202 is loaded, via bus 206, into Receiver Digital Buffer 207 consisting of N+1 cells 207-1 through 207-N+1.

The serial data from Communication Link Receiver 201 is also applied to Frame Synchronizer 203 which, in one embodiment, comprises an 1:(N+1) frequency divider clocked by the serial data rate. In one embodiment, the frequency divider is clocked by clock signal at the serial data rate which is provided by a clock recovery phase lock loop (not shown) as is well known in the art. In one embodiment, this serial data rate clock signal is provided in accordance with the teachings of the aforementioned patent application of Corsetto et al. The output signal on lead 205 of Frame Synchronizer 203 is one pulse per N+1 serial bits, thereby defining the boundaries of each N+1 serial data frame. Correct phase of this pulse relative to the received bits is ensured by properly resetting Frame Synchronizer 203 when receiving the training sequence, as described above. The output of the communication link receiver contains logic-zero-to-logic-one and logic-one-to-logic-zero transitions only at boundaries between the groups of N+1 bits during the transmission of the training sequence (see Table II). Pulses shorter than a bit time interval are generated from those transitions. This is done, for example, by differentiation which results in a positive pulse for a zero-to-one transition and a negative pulse for a one-to-zero transition (assuming positive logic). Frame synchronizer 203 is a 1:(N+1) counter with a reset input lead. For a counter which responds to a positive reset pulse, the differentiated transitions are applied to the reset input lead and the first zero-to-one transition forces the counter into the proper phase. Alternatively, the pulses are full-wave rectified, in which case both a zero-to-one and a one-to-zero transition properly phase the Frame Synchronizer. Before the training sequence ceases and data transmission begins, this operation has to be terminated to prevent resetting of the Frame Synchronizer by data transitions. The output signal from Frame Synchronizer 203 as applied to Serial to Parallel Converter 202 is in proper phase with respect to the serial data on line 204 to ensure that bit 1 of each group of N+1 bits is stored in cell 207-1 of Receiver Digital Buffer 207, bit 2 is stored in cell 207-2, and the indicator bit is stored in cell 207-N+1.

The data from cells 207-1 through 207-N are applied to Receiver Conditional Inverter 211 which, in one embodiment, is similar to the embodiment of Transmitter Conditional Inverter 103 of FIG. 3 but only requires N Exclusive OR gates instead of the N+1 gates needed for Transmitter Conditional Inverter 103. Control input lead 208 of Receiver Conditional Inverter 211 receives the indicator bit from cell 207-N+1 of Receiver Digital Buffer 207. Based on the binary value of the indicator bit, Receiver Conditional Inverter 211 either inverts or does not invert the N data bits stored in Receiver Digital Buffer 207, such that the N bits output by Receiver Conditional Converter 211 on bus 212 are identical to the N data bits supplied for transmission by transmitter circuitry 100 (FIG. 1).

Figure 5:
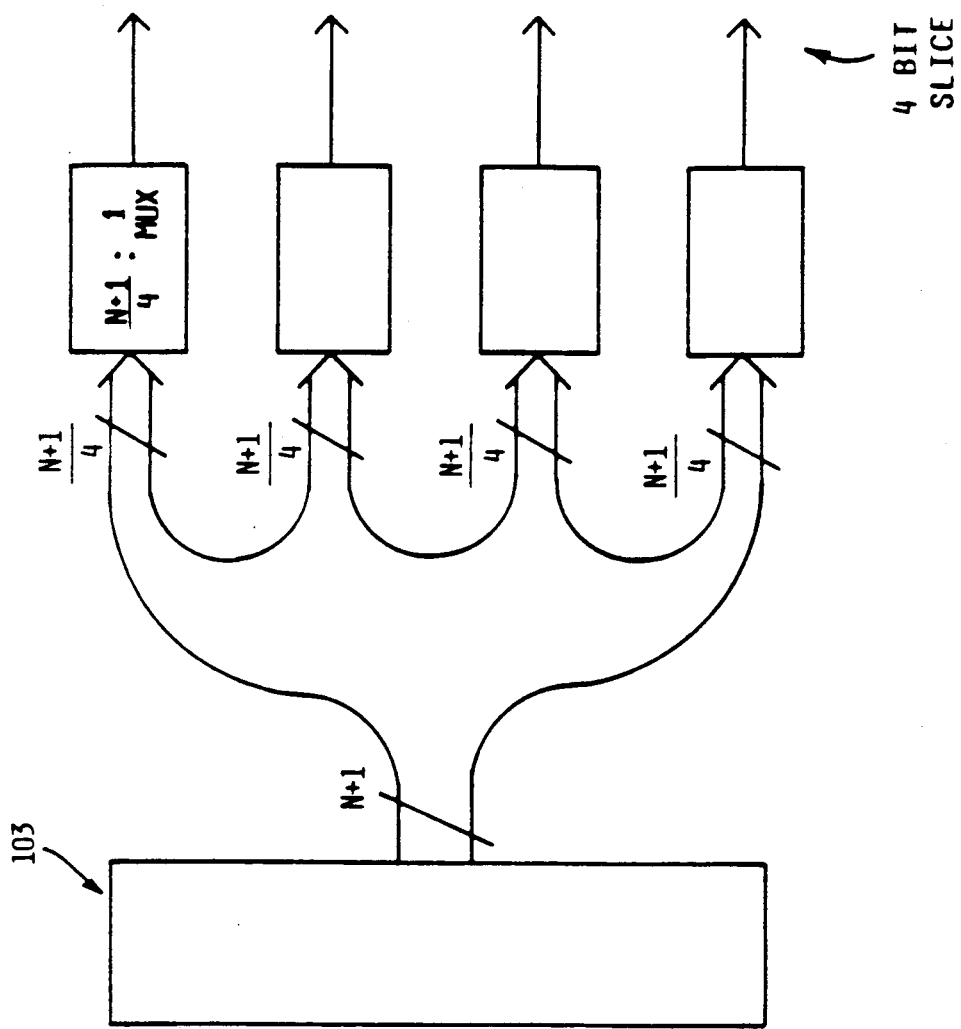
FIG. 5 is a diagram depicting multiplexers used to convert the N+1 bit wide word output of transmitter conditional inverter 103 of FIG. 1 into bit slices.

An alternative embodiment allows proper operation when the serial bit rate of the communication link is so high that an up/down counter, serving as cumulative polarity sensor 114 (FIG. 1), clocked at the serial bit rate is inconvenient to implement. In this embodiment Cumulative Polarity Sensor 114 includes an up/down counter with clock rate lower than the serial bit rate of the communication link, but which is incremented by multiple counts per clock cycle. Let us assume that N+1 is, for example, a multiple of 4. Then four multiplexers operating side by side can be used to convert each N+1 bit wide word output of Transmitter Conditional Inverter 103 into $$\frac{N+1}{4}$$

four-bit wide slices with one four-bit wide slice being available at any given time, as shown in FIG. 5. The rate of the four-bit wide slices is four times less than the serial bit rate. In order to compensate for the up/down counter running four times slower than the serial bit rate, the four-bit wide slice must be able to change the count stored in the up/down counter by more than one count per counter clock cycle. Table III depicts the relationship between the four-bit slice and the number of counts per counter clock cycle:

TABLE III

| Structure of four-bit Slice | Contribution to Cumulative Polarity Count | Number of Counts per Clock Cycle |
|---|---|---|
| 4 ones, no zero | +4 | +2 |
| 3 ones, 1 zero | +2 | +1 |
| 2 ones, 2 zeros | 0 | 0 |
| 1 one, 3 zeros | −2 | −1 |
| No one, 4 zeros | −4 | −2 |

As can be seen in the center column, the contributions of four-bit slice of data to the cumulative polarity count differ by increments of two. Therefore the counts per clock cycle required to track the cumulative polarity can be one half of these contributions with no loss of information, since the information supplied by Cumulative Polarity Sensor 114 is only the sign of the difference between past ones and zeros, not the amount of this difference.

Figure 6:
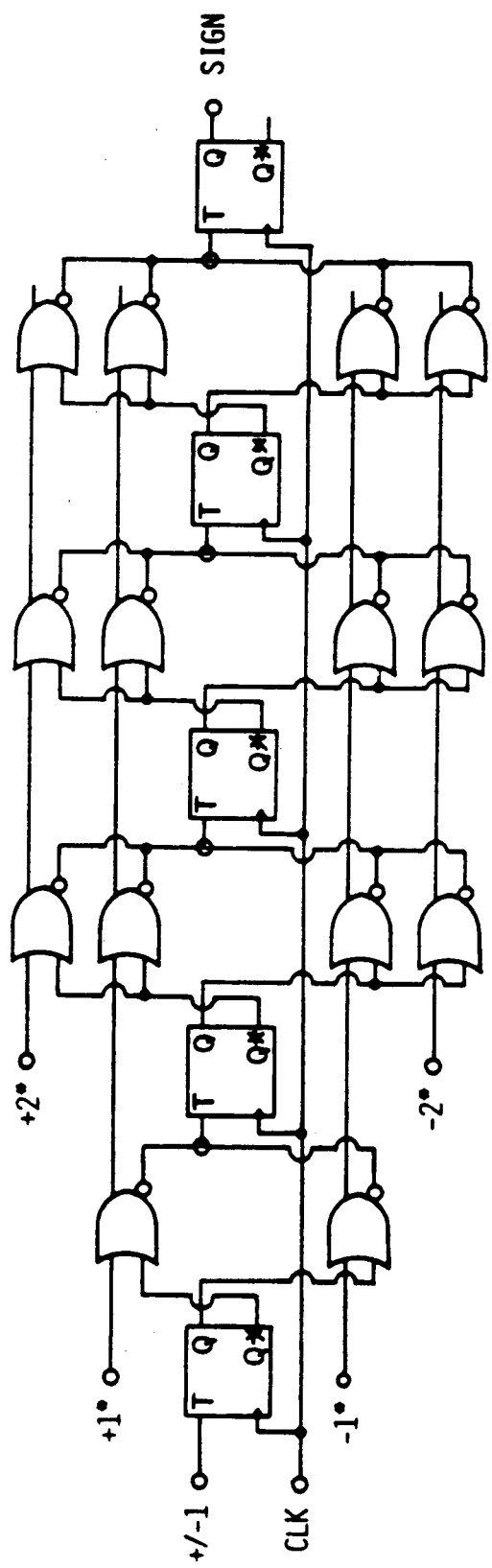
FIG. 6 is a schematic diagram of one embodiment of an up/down 1,2 counter suitable for use with this invention.

The signals required to change the up/down counter by the proper number of counts are, in one embodiment, stored in a 16×5 bit, Read Only Memory (ROM). The four-bit slice controls the ROM address. The five ROM outputs drive various points of the up/down counter to achieve the proper change in stored count per clock cycle, as shown in FIG. 6 and described by T. A. Last, "Proportional Step Size Tracking Analog-to-Digital Converter," *Rev. Sci. Instrum.*, 51(3), 369, March 1980.

Figure 7:
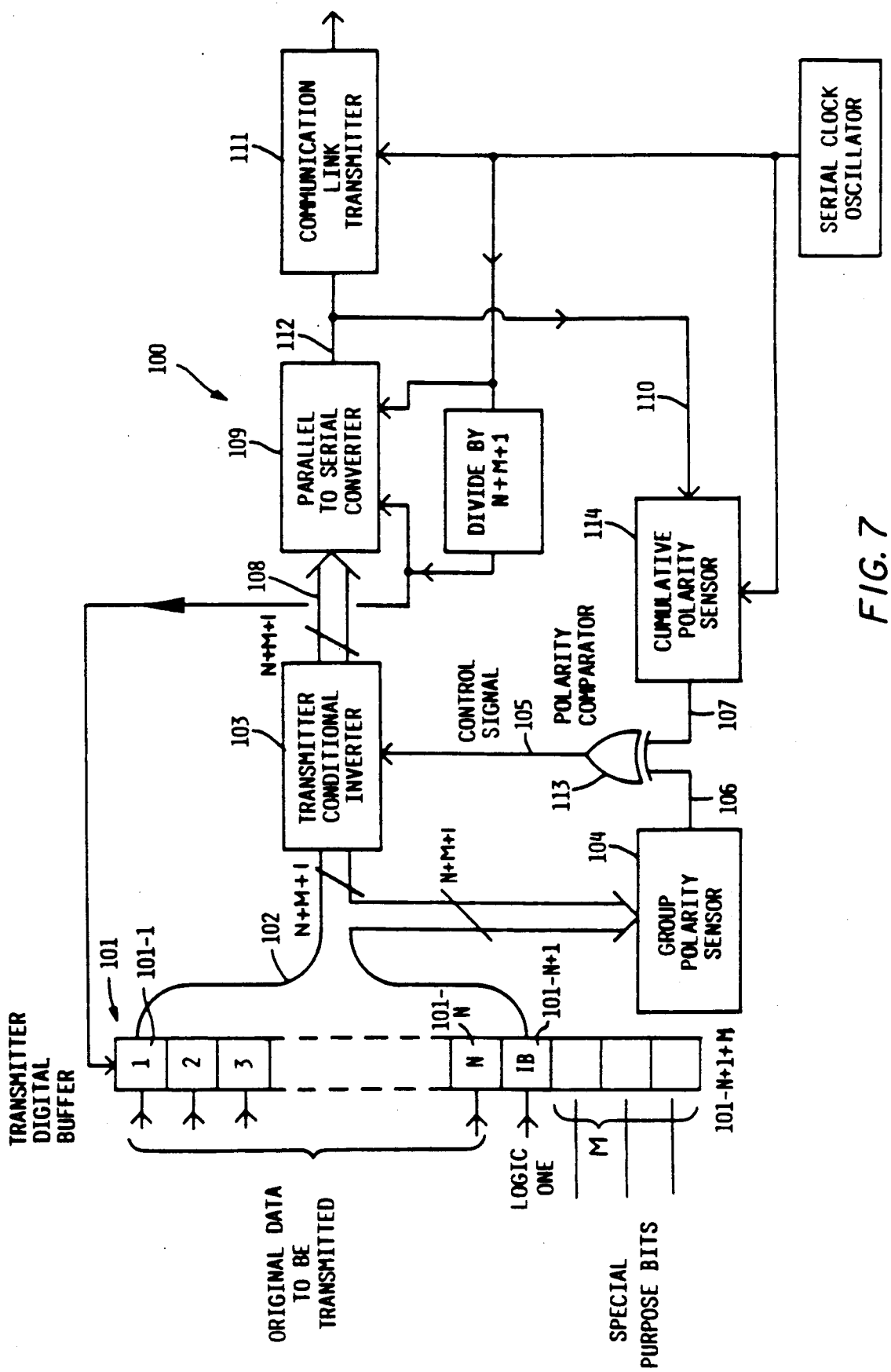
FIG. 7 is an alternative embodiment of a transmitter of this invention in which M additional bits are appended to the N data bits.
Figure 8:
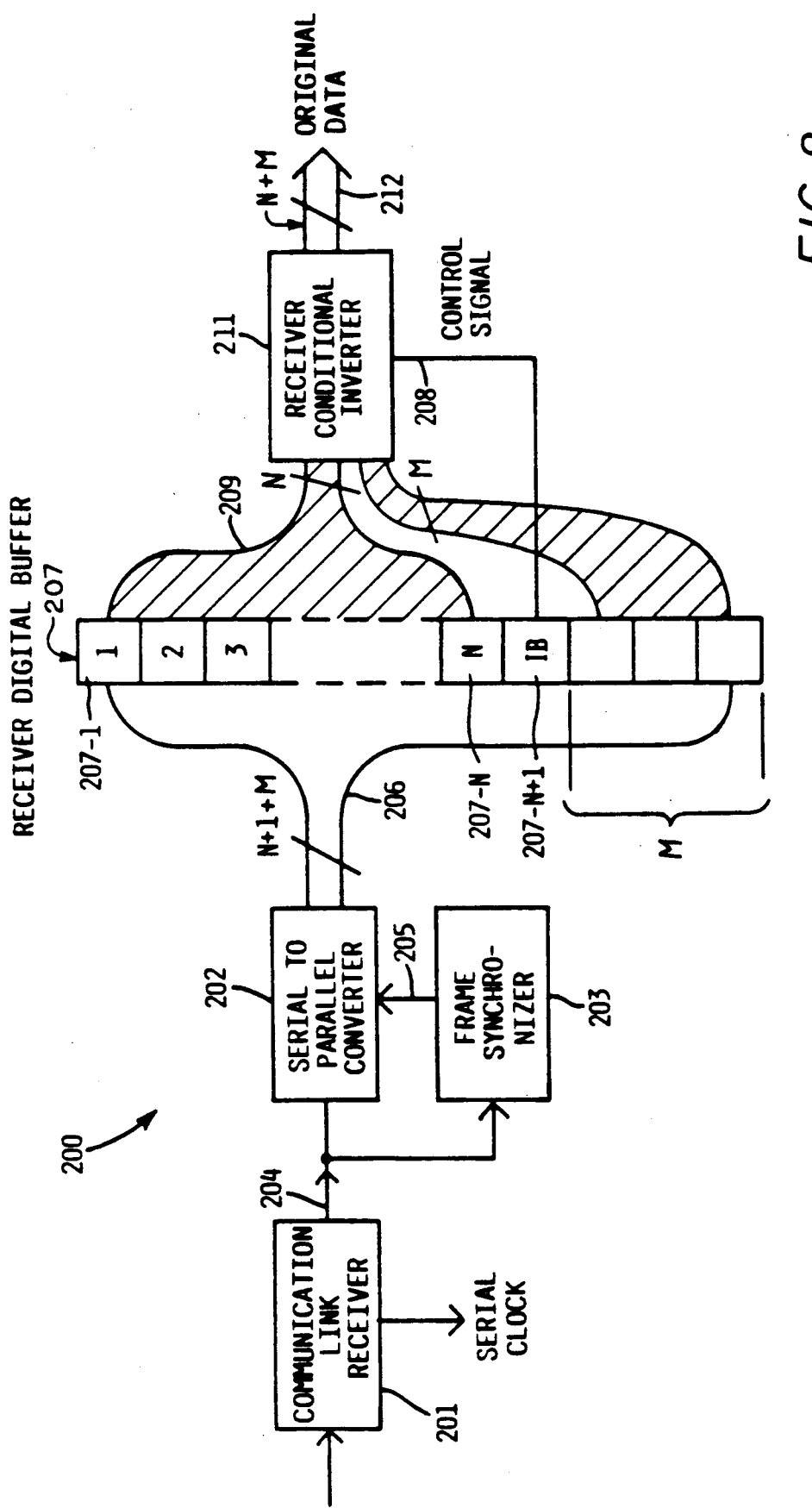
FIG. 8 is a diagram depicting an embodiment of a receiver suitable for use with the transmitter of FIG. 7.
Figure 9:
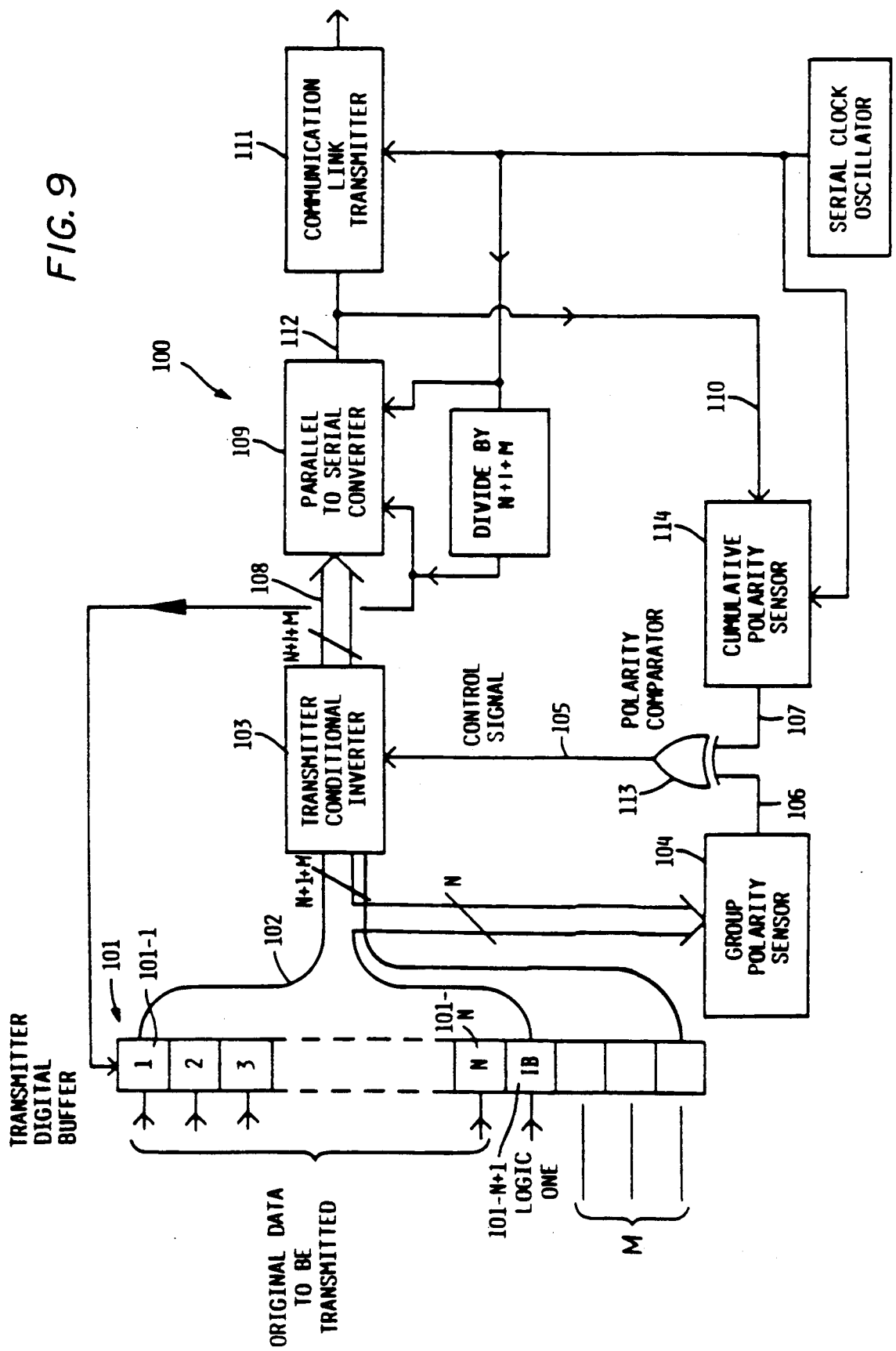
FIG. 9 is an alternative embodiment a transmitter of this invention in which M additional bits are appended to N data bits with the M additional bits and the indicator bit being balanced.
Figure 10:
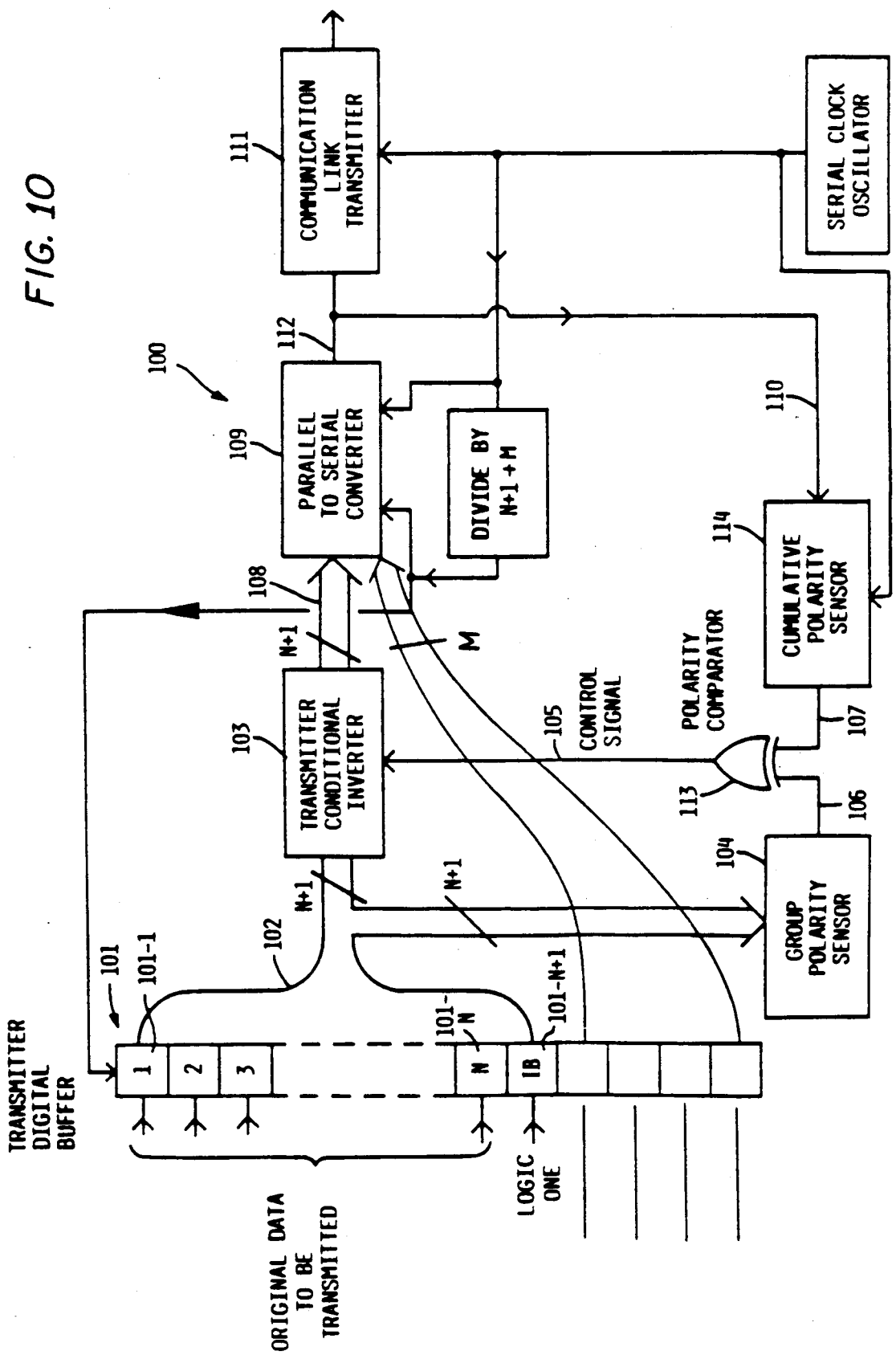
FIG. 10 is one embodiment of a transmitter in which the M appended bits are by themselves balanced and not applied to a transmitter conditional inverter.
Figure 11:
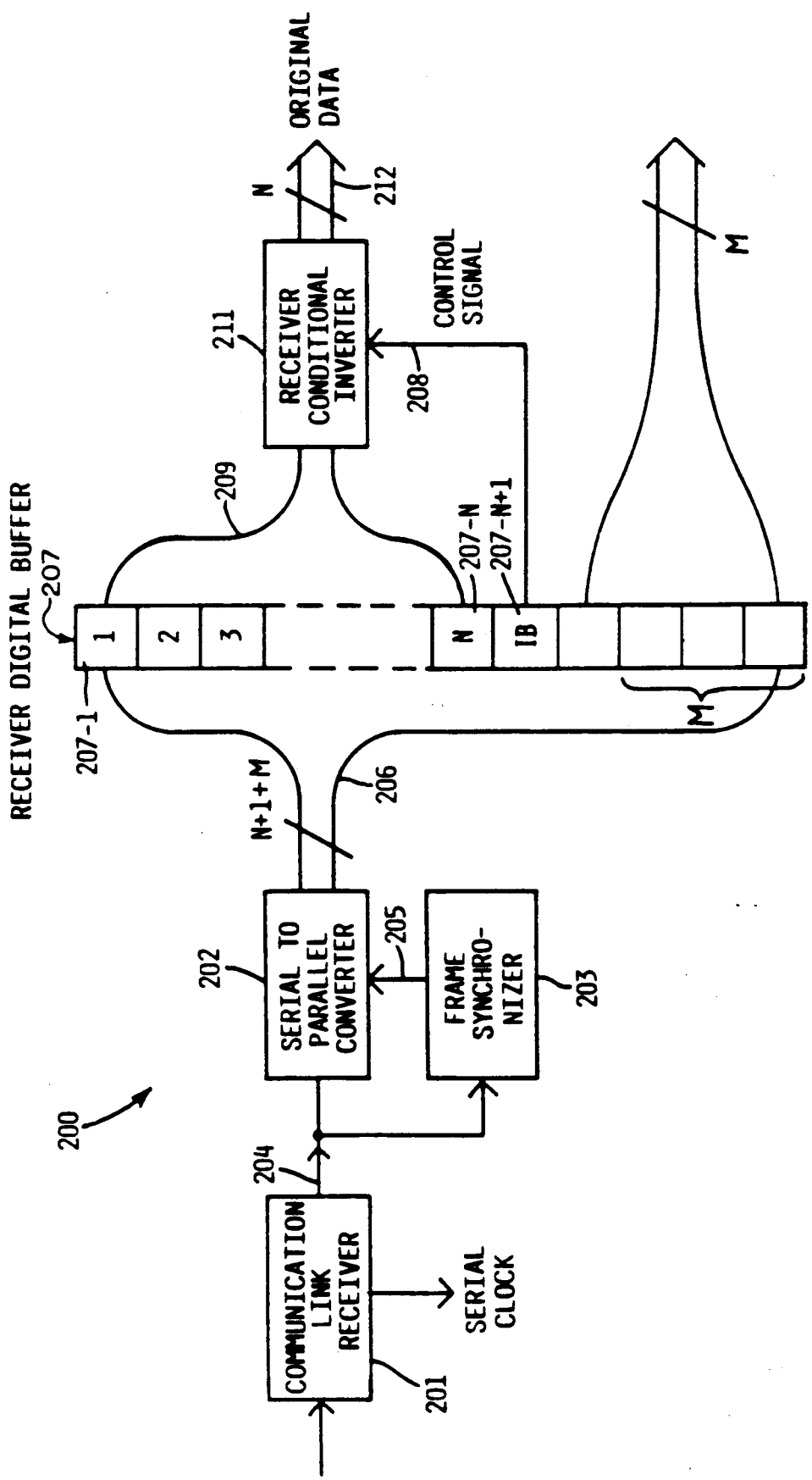
FIG. 11 is one embodiment of a receiver suitable for use with the transmitter of FIG. 10.

In another alternative embodiment, in addition to the appended indicator bit, M additional bits are appended to the N data bits. These M additional appended bits can be used for many special purposes such as clock recovery and/or any desired frame synchronization method other than the one described above. In one embodiment (as shown in FIGS. 7 and 8), such additional appended bits and the indicator bit need not be by themselves balanced, and the entire N+1+M bits are applied to Transmitter Conditional Inverter 103, Receiver Conditional Inverter 211, Group Polarity Sensor 104, and Cumulative Polarity Sensor 114 In an alternative embodiment (as shown in FIGS. 9 and 8), the M additional appended bits and the indicator bit are by themselves balanced, and thus they do not influence the polarity of the transmitted group of N+1+M bits. In this embodiment, it is not necessary to apply the M additional appended bits and the indicator bit to either Group Polarity Sensor 104 or Cumulative Polarity Sensor 114, thereby affording easier timing requirements for reading the output signal from Cumulative Polarity Sensor 114. However, the polarity of the indicator bit on the receiver end still indicates whether the N+1+M bits were or were not inverted on the transmitter side. More importantly, in this embodiment when Cumulative Polarity Sensor 114 uses a lower speed counter which is incremented, for example, by a four-bit wide slice as previously discussed, it is now N which must be a multiple of 4 rather than N+M. In many instances, this provides a much better match to conventional word lengths. In yet another embodiment, the M appended bits, when by themselves balanced, are not applied to Transmitter Conditional Inverter 103 and therefore need not be applied to Group Polarity Sensor 104 and/or Cumulative Polarity Sensor 114. The information whether the N bits have been or have not been inverted on the transmitter side can be conveyed to the receiver using an indicator bit as before (FIGS. 10 and 11), or by encoding that information together with other information to be transmitted into the M bits (while maintaining their balance), in which case the indicator bit can be omitted, as in the embodiments of FIGS. 12 and 13. For either of these embodiments, the M bits do not pass through the Receiver Conditional Inverter 211 because these M bits were not inverted on the transmitter side. In another embodiment, the N bits together with the indicator bit are balanced over time, and thus need not be applied to transmitter conditional inverter 103.

Figure 12:
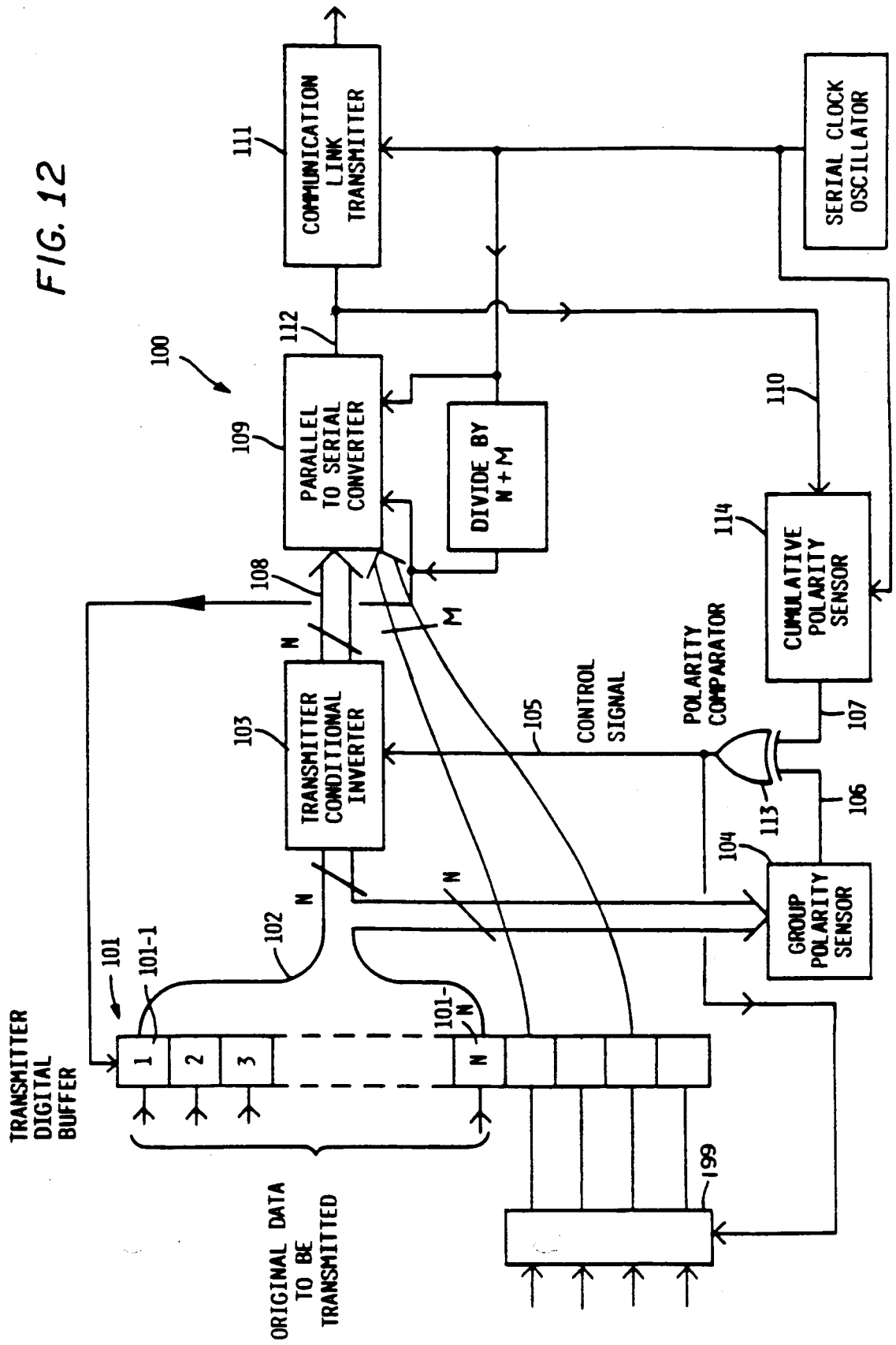
FIG. 12 is an embodiment of a circuit similar to that of FIG. 10 in which information as to whether the N data bits have or have not been inverted is encoded into the M additional bits.
Figure 13:
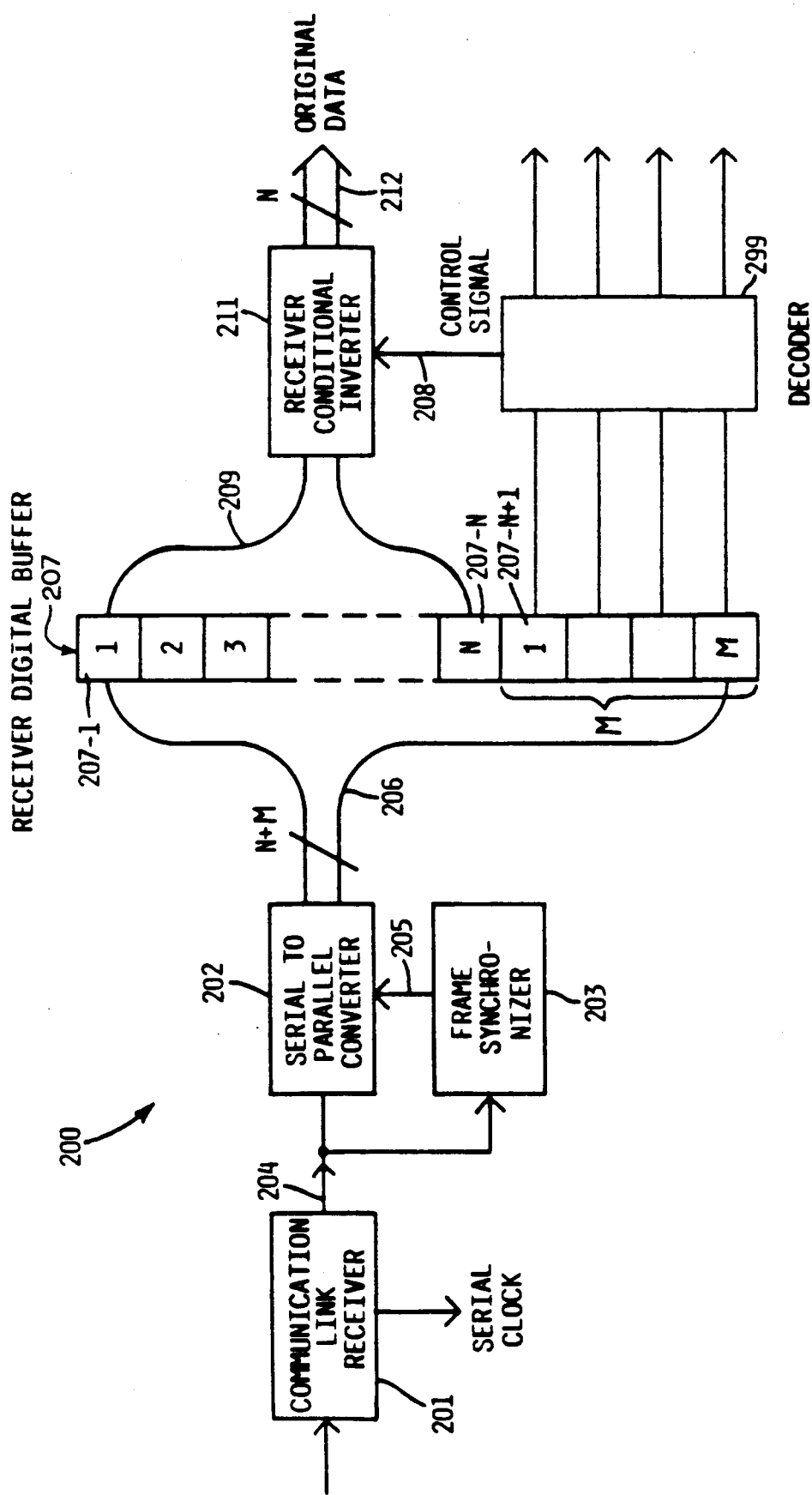
FIG. 13 is one embodiment of a receiver suitable for use with the transmitter of FIG. 12.

The embodiments shown in FIGS. 12 and 13 includes additional encoder 199 (FIG. 12) which serves to modify the M additional bits depending upon whether the N data bits were or were not inverted, thereby encoding this information in the M additional bits. As shown in FIG. 13, decoder 299 serves to decode the M additional bits and provide a control signal to receiver conditional inverter 211 depending on whether the N data bits were or were not inverted.

Often the need arises to send non-data, service-like signals over the link, and these signals must be recognized on the receiving side as non-data signals. Non-data signals are required, for example, for handshaking at link start-up. Groups of N bits carrying non-data can be distinguished from groups of N bits carrying data by suitably encoding M bits appended for this purpose. In this embodiment, these appended bits can be treated as discussed above with regard to the various embodiments which include M appended bits.

However, if the non-data appended M bits (FIGS. 10 and 12) or the non-data appended M bits and the indicator bit (FIG. 9) are by themselves not balanced and are not processed by Group Polarity Sensor 104 and Cumulative Polarity Sensor 114 in order to gain the advantages described above (i.e. eased timing requirements in the lower speed up/down counter), then the contribution of the non-balanced and not-sensed M or M+1 appended bits can generate an imbalanced component in the line code. In one embodiment of this invention, this potential imbalance is prevented by insuring that imbalanced groups of N+M (FIG. 12) or N+M+1 (FIGS. 9 and 10) bits carrying non-data signals are transmitted in pairs of complementary imbalance. In an alternative embodiment, this potential imbalance is prevented by insuring that the non data signals are restricted only to codes which have an equal number of ones and zeros including the non-balanced appended M or M+1 bits. This guarantees a balanced line code. Therefore, in both embodiments, the transmitter and receiver conditional inverter must be rendered inactive. However, Cumulative Polarity Sensor 114, not seeing the non-balanced appended M or M+1 bits, could accumulate an error. For this reason, during the transmission of non-data signals, the count stored in Cumulative Polarity Sensor 114 must be held constant. This is achieved, for example, by interrupting the clock signal driving Cumulative Polarity Sensor 114 while non-data signals are being transmitted.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A method of encoding data for transmission over a communications link comprising the steps of:

obtaining a plurality of N data bits, where N is a positive integer;

forming a group of bits by including an indicator bit of known value to said N data bits in a predefined location within said group of bits;

determining whether said group of bits has a positive polarity such that said group of bits contains more logical one bits than logical zero bits or whether said group of bits has a negative polarity such that said group of bits contains less logical one bits than logical zero bits;

maintaining a cumulative polarity value of the bits previously transmitted over said communications link, said cumulative polarity value being positive when more logical one bits than logical zero bits have been transmitted and said cumulative polarity value being negative when less logical one bits than logical zero bits have been transmitted, said step of maintaining a cumulative polarity value comprising the steps of:

receiving said group of bits consisting of said plurality of N data bits and said indicator bit;

separating said group of bits into a plurality of subgroups of bits; and for each of said subgroups of bits, incrementing or decrementing said cumulative polarity value by an appropriate number utilizing memory means having address input leads connected to receive each of said subgroups of bits, in sequence, and a data output port for providing an output signal indicating whether said cumulative polarity value should be incremented or decremented, and said appropriate number; and forming a set of bits to be transmitted by inverting all bits within said group of bits when said group of bits has a polarity which is the same as said cumulative polarity, and not inverting the bits within said group of bits when said group of bits has a polarity which is the opposite of said cumulative polarity.

2. A method of encoding data for transmission over a communications link comprising the steps of:

obtaining a plurality of N data bits, where N is a positive integer;

forming a group of bits by including an indicator bit of known value to said N data bits in a predefined location within said group of bits;

determining whether said group of bits has a positive polarity such that said group of bits contains more logical one bits than logical zero bits or whether said group of bits has a negative polarity such that said group of bits contains less logical one bits than logical zero bits;

maintaining a cumulative polarity value of at least said N data bits previously transmitted over said communications link, said cumulative polarity value being positive when more logical one bits than logical zero bits have been transmitted and said cumulative polarity value being negative when less logical one bits than logical zero bits have been transmitted;

forming a set of bits to be transmitted by inverting all bits within said group of bits when said group of bits has a polarity which is the same as said cumulative polarity and not inverting the bits within said group of bits when said group of bits has a polarity which is the opposite of said cumulative polarity; and including an additional M bits, where M is a positive integer to said set of bits prior to transmission.

3. The method as in claim 2 wherein said M bits have a substantially equal number of logical zeros and logical ones.

4. The method as in claim 3 wherein said step of maintaining comprises the step of maintaining a cumulative polarity value of said N+1 bits and not said M bits previously transmitted over said communications link.

5. The method as in claim 2 wherein, over time, a plurality of occurrences of said M bits have a substantially equal number of logical ones and logical zeros.

6. The method as in claim 5 wherein said step of maintaining comprises the step of maintaining a cumulative polarity value of said N+1 bits and not said M bits previously transmitted over said communications link.

7. A method as in claim 2 wherein said step of maintaining comprises the step of maintaining a cumulative polarity value of at least said N data bits and said indicator bit.

8. A method of encoding data for transmission over a communications link comprising the steps of:

obtaining a plurality of N data bits, where N is a positive integer;

obtaining a plurality of M additional bits, where M is a positive integer;

determining whether said plurality of N data bits have a positive polarity such that said N data bits contains more logical one bits than logical zero bits or whether said group of bits has a negative polarity such that said group of bits contains less logical one bits than logical zero bits;

maintaining a cumulative polarity value of at least the N bits previously transmitted over said communications link, said cumulative polarity value being positive when more logical one bits than logical zero bits have been transmitted and said cumulative polarity value being negative when less logical one bits than logical zero bits have been transmitted, said step of maintaining a cumulative polarity value comprising the steps of:

receiving said group of bits consisting of said plurality of N data bits;

separating said group of bits into a plurality of subgroups of bits; and for each of said subgroups of bits, incrementing or decrementing said cumulative polarity value by an appropriate number utilizing memory means having address input leads connected to receive each of said subgroups of bits, in sequence, and a data output port for providing an output signal indicating whether said cumulative polarity value should be incremented or decremented, and said appropriate number;

encoding said M additional bits in response to said polarity of said N data bits and said cumulative polarity, thereby forming a group of M encoded bits indicating whether said N data bits are to be inverted prior to transmission; and forming a set of bits to be transmitted consisting of said M encoded bits and N encoded bits formed by inverting all of said N data bits when said N data bits have a polarity which is the same as said cumulative polarity, and not inverting said N data bits when said N data bits have a polarity which is the opposite of said cumulative polarity.

9. The method as in claim 8 wherein said M bits have a substantially equal number of logical zeros and logical ones.

10. The method as in claim 8 wherein, over time, a plurality of occurrences of said M bits have a substantially equal number of logical ones and logical zeros.

11. A method for the transmission of data over a communications link comprising the steps of:

obtaining a plurality of a N data bits, where N is a positive integer;

forming a group of bits by including an indicator data bit of known indicator value to said N data bits in a predefined location within said group of bits;

determining whether said group of bits has a positive polarity such that said group of bits contains more logical one bits than logical zero bits or whether said group of bits has a negative polarity such that said group of bits contains less logical one bits than logical zero bits;

maintaining a cumulative polarity value of the bits previously transmitted over said communications link, said cumulative polarity value being positive when more logical one bits than logical zero bits have been transmitted and said cumulative polarity value being negative when less logical one bits than logical zero bits have been transmitted, said step of maintaining comprising the steps of:

receiving said group of bits consisting of said plurality of N data bits and said indicator data bit;

separating said group of bits into a plurality of subgroups of bits; and for each of said subgroups of bits, incrementing or decrementing said cumulative polarity value by an appropriate number, wherein said step of incrementing or decrementing is performed by memory means having address input leads connected to receive each of said subgroups of bits, in sequence, and a data output port for providing an output signal indicating whether said cumulative polarity value should be incremented or decremented, and said appropriate number;

forming a set of bits to be transmitted by inverting all bits within said group of bits when said group of bits has a polarity which is the same as said cumulative polarity, and not inverting the bits within said group of bits when said group of bits has a polarity which is the opposite of said cumulative polarity;

transmitting said set of bits over said communications link;

receiving said set of bits;

determining within said set of bits the location of said indicator bit; and when said indicator bit has the same value as said known indicator value, passing N bits as N data bits, where N is a positive integer, from said set of bits and, when said indicator bit has an opposite value as said known indicator value, inverting said N bits from said set of bits prior to passing said passing the inverted values as N data bits.

12. A method for the transmission of data over a communications link comprising the steps of:

obtaining a plurality of N data bits, where N is a positive integer;

forming a group of bits by including an indicator data bit of known indicator value to said N data bits in a predefined location within said group of bits;

determining whether said group of bits has a positive polarity such that said group of bits contains more logical one bits than logical zero bits or whether said group of bits has a negative polarity such that said group of bits contains less logical one bits than logical zero bits;

maintaining a cumulative polarity value of the bits previously transmitted over said communications link, said cumulative polarity value being positive when more logical one bits than logical zero bits have been transmitted and said cumulative polarity value being negative when less logical one bits than logical zero bits have been transmitted;

forming a set of bits to be transmitted by inverting all bits within said group of bits when said group of bits has a polarity which is the same as said cumulative polarity, and not inverting the bits within said group of bits when said group of bits has a polarity which is the opposite of said cumulative polarity;

including an additional M bits, where M is a positive integer, to said set of bits prior to transmission;

transmitting said set of bits over said communications link;

receiving said set of bits;

determining within said set of bits the location of said indicator bit; and when said indicator bit has the same value as said known indicator value, passing N bits as N data bits, where N is a positive integer, from said set of bits and, when said indicator bit has an opposite value as said known indicator value, inverting said N bits from said set of bits prior to passing said passing the inverted values as N data bits.

13. The method as in claim 12 wherein said M bits have a substantially equal number of logical zeros and logical ones.

14. The method as in claim 12 wherein, over time, a plurality of occurrences of said M bits have a substantially equal number of logical ones and logical zeros.

15. An apparatus for encoding data to be transmitted comprising:

means for obtaining a plurality of N data bits, where N is a positive integer;

means for forming a group of bits by including an indicator bit of known value to said N data bits in a predefined location within said group of bits;

a group polarity sensor for determining whether said group of bits has a positive polarity such that said group of bits contains more logical one bits than logical zero bits or whether said group of bits has a negative polarity such that said group of bits contains less logical one bits than logical zero bits, said group polarity sensor comprising:

a first current summing node associated with logical one bits;

a second current summing node associated with logical zero bits;

a plurality of current sources, each associated with a selected one of said N+1 bits forming said group of bits;

a plurality of switch means, each associated with a selected one of said current sources, each said switch means connecting its associated current source to said first current summing node when its associated bit is a logical one and connecting its associated current source to said second current summing node when its associated bit is a logical zero; and a comparator for comparing the sum of the currents connected to said first current summing node with the sum of the currents connected to said second current summing node and providing an output signal indicating whether said group of N+1 bits contains more logical ones than logical zeros or less logical ones than logical zeros;

a cumulative polarity sensor for maintaining a cumulative polarity value of the bits previously transmitted over said communications link, said cumulative polarity value being positive when more logical one bits than logical zero bits have been transmitted and said cumulative polarity value being negative when less logical one bits than logical zero bits have been transmitted; and a transmitter conditional inverter for forming a set of bits to be transmitted by inverting all bits within said group of bits when said group of bits has a polarity which is the same as said cumulative polarity, and not inverting the bits within said group of bits when said group of bits has a polarity which is the opposite of said cumulative polarity.

16. A method of encoding data for transmission over a communications link comprising the steps of:

obtaining a plurality of N data bits, where N is a positive integer;

obtaining a plurality of M additional bits, where M is a positive integer;

determining whether said plurality of N data bits have a positive polarity such that said N data bits contains more logical one bits than logical zero bits or whether said group of bits has a negative polarity such that said group of bits contains less logical one bits than logical zero bits utilizing a group of polarity sensor comprising:

a first current summing node associated with logical one bits;

a second current summing node associated with logical zero bits;

a plurality of current sources, each associated with a selected one of said N bits forming said group of bits;

a plurality of switch means, each associated with a selected one of said current sources, each said switch means connecting its associated current source to said first current summing node when its associated bit is a logical one and connecting its associated current source to said second current summing node when its associated bit is a logical zero; and a comparator for comparing the sum of the currents connected to said first current summing node with the sum of the currents connected to said second current summing node and providing an output signal indicating whether said group of N bits contains more than logical zeros than logical ones or less logical ones than logical zeros;

maintaining a cumulative polarity value of at least the N bits previously transmitted over said communications link, said cumulative polarity value being positive when more logical one bits than logical zero bits have been transmitted and said cumulative polarity value being negative when less logical one bits than logical zero bits have been transmitted;

encoding said M additional bits in response to said polarity of said N data bits and said cumulative polarity, thereby forming a group of M encoded bits indicating whether said N data bits are inverted prior to transmission; and forming a set of bits to be transmitted consisting of said M encoded bits and N encoded bits formed by inverting all of said N data bits when said N data bits have a polarity which is the same as said cumulative polarity, and not inverting said N data bits when said N data bits have polarity which is the opposite of said cumulative polarity.

17. The method as in claim 16 wherein said M bits have a substantially equal number of logical zeros and logical ones.

18. The method as in claim 16 wherein, over time, a plurality of occurrences of said M bits have a substantially equal number of logical ones and logical zeros.

* * * * *

UNITED STATES PATENT AND TRADEMARK OFFICE
CERTIFICATE OF CORRECTION

PATENT NO. : 5,022,051

DATED : June 4, 1991

INVENTOR(S) : Douglas Crandall et al.

It is certified that error appears in the above-identified patent and that said Letters Patent is hereby corrected as shown below:

Column 1, line 33, "A DC-Balanced, Balanced, Partitioned Block" should read -- A DC-Balanced, Partitioned Block --;

Column 6, line 22, "utilizing a 16:1 multiplexer," should read -- utilizing a multiplexer, --;

Column 6, line 23 "A Gb/s High Yield and Lower Power Dissipation" should read -- A Gb/s 16:1 Multiplexer and 1:16 Demultiplexer Chip Set with High Yield and Lower Power Dissipation --;

Column 8, line 15, "output of Transmitter" should read -- output from Transmitter --;

Column 8, line 22, "four-bit wide slices" should read -- four-bit wide slice --.

Signed and Sealed this

Twentieth Day of July, 1993

Attest:

MICHAEL K. KIRK

Attesting Officer

Acting Commissioner of Patents and Trademarks